(12) United States Patent
Wyles et al.

(10) Patent No.: US 6,587,001 B1
(45) Date of Patent: Jul. 1, 2003

(54) ANALOG LOAD DRIVER

(75) Inventors: Richard H. Wyles, Carpinteria, CA (US); John L. Vampola, Santa Barbara, CA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 10/255,415

(22) Filed: Sep. 25, 2002

(51) Int. Cl.[7] .............................................. H03F 3/04
(52) U.S. Cl. ...................... 330/296; 330/277; 330/288
(58) Field of Search .............................. 330/277, 288, 330/296; 327/108, 111, 112, 427, 434, 435, 437

(56) References Cited

U.S. PATENT DOCUMENTS 5,881,014 A * 3/1999 Ooishi ...................... 365/226
6,333,623 B1 * 12/2001 Heisley et al. .............. 323/280

* cited by examiner

Primary Examiner—Henry Choe
(74) Attorney, Agent, or Firm—William C. Schubert; Glenn H. Lenzen, Jr.

(57) ABSTRACT

An electronic circuit device for driving a load comprises a load terminal, a control terminal and a power terminal for connection to a source of electric power. The load terminal may be in an emitter or a source circuit of the circuit device, and connects to a power supply return terminal by means of three electric elements connected in parallel, namely, the capacitance of a load, a bias current supply, and a current bypass. A voltage sensor is connected between the control terminal and the load terminal for sensing a voltage drop developed between the control terminal and the load terminal. The voltage sensor it is operative to activate the bypass to conduct current in parallel with current flow of the current source in the situation wherein the voltage drop exceeds a threshold. Thereby, the circuit device drives the load in one direction, and the current source and the bypass drive the load in the opposite correction.

7 Claims, 2 Drawing Sheets

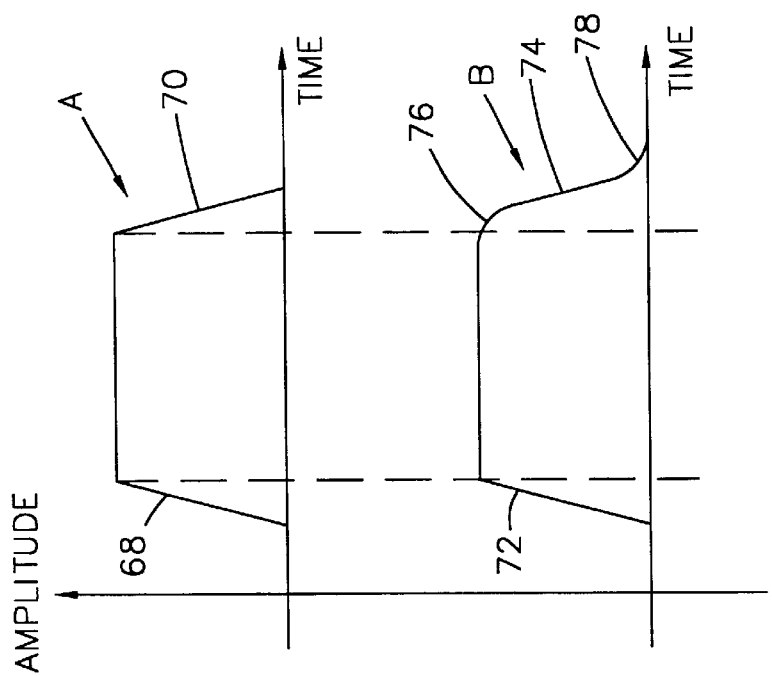
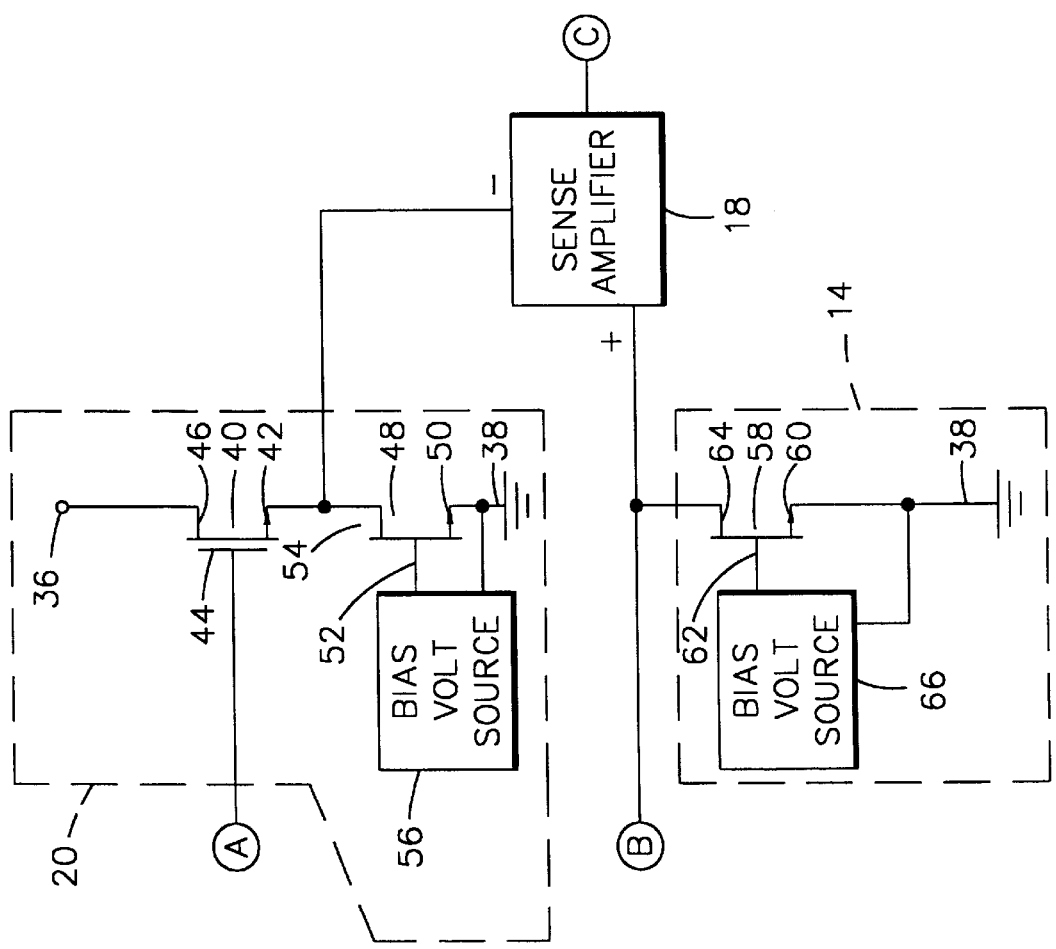
FIG. 3
FIG. 2

ANALOG LOAD DRIVER

BACKGROUND OF THE INVENTION

This invention relates to load driver amplifiers, also know as buffers, suitable for use as a line driver in driving signal-carrying cables in a focal plane detection circuit comprising an array of detectors such as infrared detectors, and more particularly, to construction of a buffer in the form of a source or emitter follower circuit.

A situation of particular interest herein is a focal plane detector array which comprises numerous detector elements each of which converts incident electromagnetic radiation to an electric signal. Cables connect the respective detector elements to signal processing circuitry, wherein the signals of the respective detector elements are gathered and processed electronically to produce an image of a scene being viewed by the array of detectors. Buffers interconnect the detector elements with the cables for driving the cables with the respective detected signals. For viewing subject matter that changes rapidly and/or for rapidly sampling signals of the detector elements, each of the buffers must have adequate bandwidth and dynamic response, in terms of slew rate, to pass both the leading edge and the trailing edge of a detected signal.

Line driver amplifiers have been constructed in the form of push-pull circuits, as well as emitter followers and source followers. Push-pull buffers based on voltage-follower operational amplifiers typically have higher power dissipation for a given settling speed, due in part to slew-rate limitations. Some designs also require a minimum output capacitance to guarantee stability, if the operational amplifier is to be compensated by the output load capacitance. Circuit designs which do not have the foregoing problems typically have low-output voltage range, or are constructed of very complex circuitry which is of disadvantage in the situation wherein space must be conserved, as in the case of the focal plane detector array. Furthermore, typical push-pull buffers of the prior art have reduced output voltage range, or require additional special bias voltages to increase the output range.

Simple source-followers or emitter-followers of the prior art have higher power dissipation for a given settling speed, due to slew-rate limitations, than is desirable in the situation of the focal plane detector array. It is noted that focal plane detector arrays are mounted typically within a cryogenic environment. Excessive power dissipation places and additional burden on the Dewar employed for regulation of the temperature. Available emitter source follower buffers suffer from higher power dissipation than do other circuits, such as the push-pull configuration and the current-mirror circuits, due to the large static current required to achieve the high slew rate and the bandwidth.

SUMMARY OF THE INVENTION

The aforementioned problems are overcome and other advantages are provided by a low power analog line driver which, in accordance with the invention, employs a sense circuit and a high-speed, dynamically activated current load to significantly reduce the power required by either a source follower or an emitter follower buffer. The circuit senses the input signal to the buffer, and compares the input signal to the output signal of the buffer. If there is a significant difference between the input and the output signals, a large load current is switched into the output of the buffer in order to temporarily speed up the response of the buffer. Once this speed-up has been accomplished, the large load current is terminated, and the emitter follower or source follower resumes normal operation with a very low load current.

The circuit of the invention has very low power dissipation when compared to competing circuits (for the same settling speed), and has a larger output swing than typical push-pull output buffers. The circuit of the invention has the additional advantage in that the circuit can be constructed directly on a chip along with other components of an electronic system to save space and facilitate manufacture. In the case of the use of the invention with a focal plane array in an optics system, such as an infrared imaging system, all components are located on a common circuit board or chip which contains the readout integrated circuit, and therefore requires no off-chip support circuitry. Furthermore, the circuit of the invention is compatible with existing electronic systems currently in use, which circuitry already includes an off-focal plane current source load. The lower power has significant positive impact on integrated Dewar assemblies and cooler margins since there is significantly lower cryogenic power dissipation. For general battery-powered analog applications, the reduced power dissipation results in longer battery life. The circuit of the invention can be utilized in numerous focal plane programs. The most significant advantage is use in those programs that utilize small tactical mechanical coolers or passive space coolers. However, it is to be noted that the circuitry of the invention is useful also in numerous other applications wherein there is a requirement for driving a high-capacitance load with a signal having a rapid rise time and a rapid fall time.

BRIEF DESCRIPTION OF THE DRAWING

The aforementioned aspects and other features of the invention are explained in the following description, taken in connection with the accompanying drawing figures wherein:

FIG. 2 is a schematic diagram of voltage offset circuitry for a sense amplifier of FIG. 1; and FIG. 3 is a timing diagram showing input and output signal waveforms.

Figure 1:
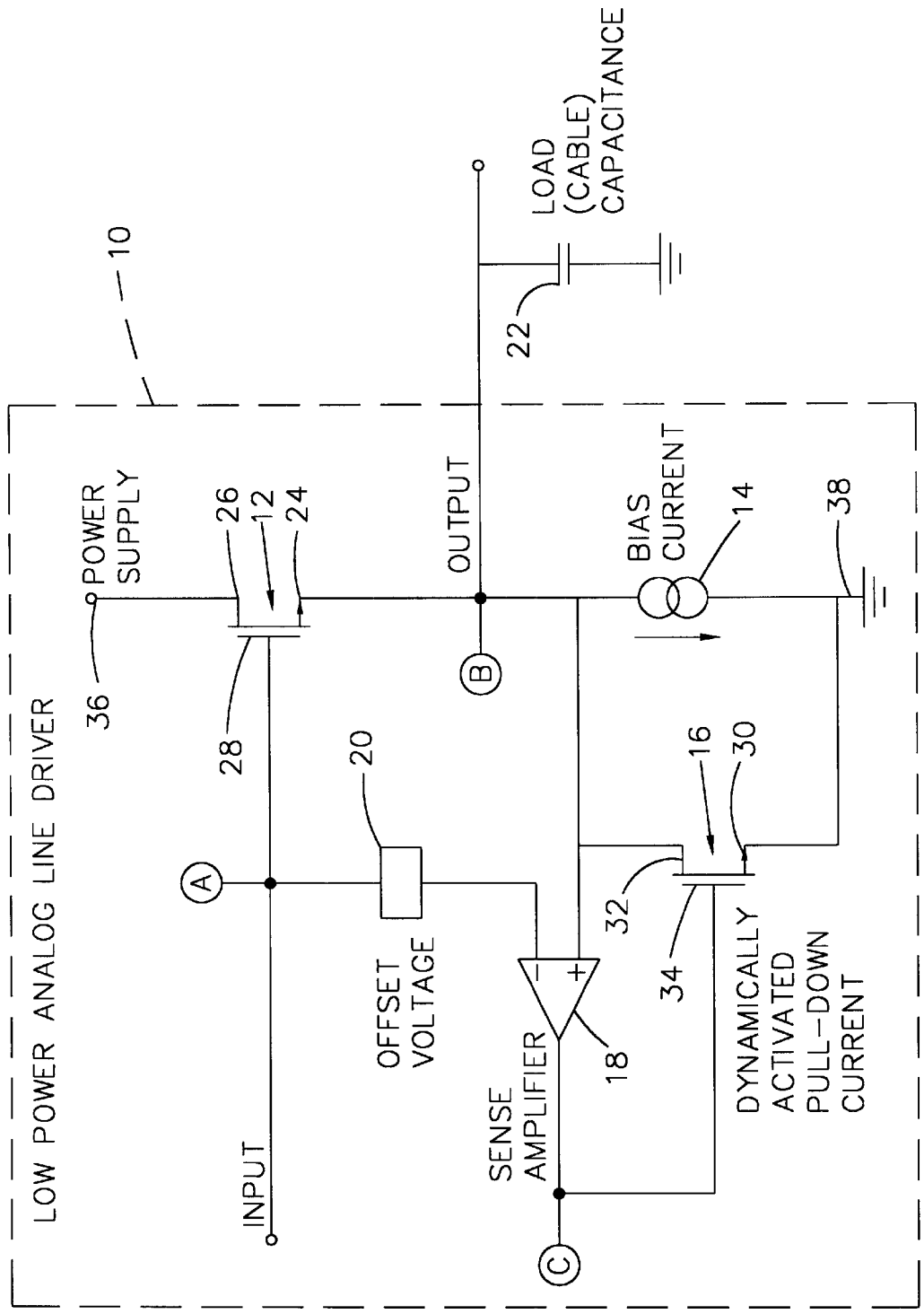
FIG. 1 is a schematic diagram of the load driver of the invention, the load being shown, by way of example, as the capacitance of an electric cable.

Identically labeled elements appearing in different ones of the figures refer to the same element but may not be referenced in the description for all figures.

DETAILED DESCRIPTION OF THE INVENTION

With reference to FIG. 1, an analog load driver 10, in accordance with the invention, comprises an electronic circuit device shown as a transistor 12, a current source 14 connected in series with the transistor 12, a current bypass 16 connected in parallel with the current source 14, a voltage sensor 18, and a voltage offset circuit 20. An input signal to the driver 10 is applied on an input signal line at terminal A, and an output signal for connection to a load is provided on an output signal line at terminal B. A load driven by the driver 10, is connected at terminal B and, by way of example, is an electric signal cable represented by a capacitor 22 because the major component of the impedance of the load is capacitance.

The transistor 12 may be either a bipolar transistor or field-effect transistor (FET), the latter being used in the preferred embodiment of the invention. The transistor 12 comprises a source 24, a drain 26 and a gate 28. The bypass 16 is also constructed as a transistor which may be either a bipolar transistor or an FET, the latter being used in the preferred embodiment of the invention. The transistor of the bypass 16 comprises a source 30, a drain 32, and a gate 34. The sensor 18 is constructed as a differential amplifier, and is operated as comparator for comparing voltages input at its two input terminals, one of which is a positive terminal and one of which is a negative terminal. An output terminal of the sensor 18, is designated as terminal C, and connects with the gate 34 of the bypass transistor. The output signal at terminal B is connected with the positive input terminal of the sensor 18. The input signal at terminal A is connected via in the offset circuit 20 to the negative input terminal of the sensor 18, and connects also with the gate 28 of the transistor 12.

In the operation of the circuitry of the driver 10, current for the transistor 12 is provided by a power supply at terminal 36, the current entering the transistor 12 at the drain 26, and exiting the transistor 12 at the source 24 to flow via terminal B and the current source 14 to ground at 38. The ground at 38 also serves as a return terminal for the power supply. The magnitude of the current provided by the source 14 is essentially independent of the voltage at terminal B and, accordingly, the current provided by the source 14 serves as a bias current in the operation of the transistor 12.

In the case of an input signal at terminal A characterized by a rising voltage, the output voltage at terminal B also rises in correspondence with the voltage at terminal A. In order to accommodate the rising of the voltage at terminal B, additional current is provided by the transistor 12 to flow into the capacitor 22 for charging the capacitor 22 to the desired voltage level at terminal B. In the case wherein the voltage at terminal A is falling, the voltage at terminal B also falls, however, such falling is limited to the rate at which charge can be withdrawn from the capacitor 22.

In order to speed up the rate at which charge is withdrawn from the capacitor 22, the bypass 16 is activated to draw additional current from the capacitor 22 via terminal B. This results in a rapid discharge of the capacitor 22 with a consequential rapid falling of the voltage at terminal B. Thereby, the voltage at terminal B can fall in correspondence with a falling of the voltage at terminal A. Accordingly, during a rising voltage at terminal A, the transistor 12 drives the load, represented by the capacitor 22, and during a falling of the voltage at terminal A, the bypass 16 drives the load.

In accordance with a feature of the invention, the bypass 16 is activated only at a time of need. Thus, if the rise and fall times of the voltage at terminal B are adequately following the rise and fall times of the voltage at terminal A, then there is no need to activate the bypass 16. Accordingly, in such situation, the bypass 16 remains deactivated. However, in the event that a falling voltage at terminal B does not fall as rapidly as does the falling voltage at terminal A, then the bypass 16 is activated to withdraw charge from the capacitor 22 at an increased rate, thereby to allow the voltage at terminal B to follow the voltage at terminal A.

The sensor 18 determines whether there is need to activate the bypass 16. The output terminal C of the sensor connects with the gate 34 of the transistor of the bypass 16. The sensor 18 in combination with the voltage offset circuit 20 serve to measure the difference in voltage between the terminals A and B. If this difference in voltage remains below a predetermined threshold, then the voltage at terminal B is considered to be adequately following the voltage at terminal A. However, in the event that the voltage at terminal A drops more rapidly than does the voltage at terminal B, so as to have a voltage difference which exceeds the threshold, then the sensor 18 outputs a voltage signal which places the transistor of the bypass 16 in a state of conduction. Thereby, the circuitry of the driver accomplishes the feature of the invention wherein the additional current of the bypass 16 is present only at a time of need, but is not otherwise present.

In FIG. 2, the offset circuit 20 is shown, in further detail, connecting the terminal A to the sensor 18. Also shown is the current source 14, in further detail, with connection to terminal B and the sensor 18. In the offset circuit 20, a transistor 40 is connected as a source follower between terminal A and the negative input terminal of the sensor 18. The transistor 40 has a source 42, a gate 44 and a drain 46. The offset circuit 20 further comprises a transistor 48 having a source 50, a gate 52 and a drain 54. Also included in the offset circuit 20 is a bias voltage source 56 connected between the gate 52 and the source 50 of the transistor 48. The source 50 is grounded. In the transistor 40, the drain 46 connects with the power supply at the terminal 36, the gate 44 connects with terminal A, and the source 42 connects both with the drain 54 of the transistor 48 and the negative input terminal of the sensor 18. The current source 14 comprises a transistor 58 having a source 60, a gate 62 and a drain 54. Also included in the current source 14 is a bias voltage source 66 connected between the gate 62 and the source 60 of the transistor 58. The drain 64 of the transistor 58 connects with the terminal B and also with the positive input terminal of the sensor 18. The source 60 of the transistor 58 is grounded.

In the operation of the offset circuit 20, the bias voltage source 56 maintains a predetermined voltage difference between the transistor terminals at the gate 52 and the source 50. In response, the transistor 48 operates to maintain a fixed current between the drain 54 and ground 38 substantially independent of the signal voltage appearing at the transistor 40. Thereby, the voltage at the drain 54 follows the input signal voltage at terminal A, but is offset therefrom by the voltage of the source 56. In a similar fashion, in the current source 14, the transistor 58 responds to the fixed bias voltage at the gate 62 by establishing a fixed amount of bias current between the drain 64 and the source 60.

The foregoing circuitry of the driver 10 has accomplished the inventive feature of providing the bypass current path for rapid discharge of the capacitance of a load, such as the capacitance of a cable driven by the driver 10. The foregoing circuitry has provided also for sensing the difference between the input and the output voltages of the driver 10, and the use of the magnitude of this differential voltage to determine the need for activation of the bypass 16. The connection of the output terminal C of the sensor 18 to the bypass 16 enables activation of the bypass 16 during such intervals of time as the threshold of the sensor 18 is exceeded. In a typical situation of use of the bypass 16, as shown in FIG. 3, the upper graph shows an ideal waveform for the input signal "A", and the lower graph shows the approximation of the waveform of the output signal "B" resulting from the operation of the circuitry of the driver 10. At the input signal, the leading edge 68 and the trailing edge 70 are shown as linear ramps. At the output signal, the leading edge 72 is a linear ramp having essentially the same configuration as the leading edge of the input signal.

However, the trailing edge 74 of the output signal has a substantially linear mid-portion delayed from the corresponding trailing edge 70 of the input signal. The delay occurs because the bypass 16 does not become activated until the differential voltage between input and output signals has reached the threshold. This results in a nonlinear shoulder 76 at the inception of the trailing edge 74. In corresponding fashion, the differential voltage drops below the threshold at the conclusion of the trailing edge 74 resulting in the nonlinear shoulder 78 at the end of the trailing edge 74. The extent of both of the shoulders 76 and 78 is dependent on the magnitude of the bias current of the source 14, and increases with increasing magnitude of the bias current. For purposes of conservation of electric power, it is desirable to reduce the magnitude of the bias current. The choice of the amount of bias current is a matter of design choice, with selection being based on assurance of stable operation of the driver circuitry.

The circuitry of the driver 10 is readily fabricated on a chip containing other semiconductor circuitry, particularly the circuitry of a focal plane detector array employed in an optical system. This permits the convenience of a unitary design to a system employing the driver of the invention.

It is to be understood that the above described embodiment of the invention is illustrative only, and that modifications thereof may occur to those skilled in the art. Accordingly, this invention is not to be regarded as limited to the embodiment disclosed herein, but is to be limited only as defined by the appended claims.

What is claimed is:

1. A driver comprising:

an electronic circuit device having a control terminal, a load terminal, and a power terminal for connection to a source of electric power, wherein the circuit device is operative to apply a signal to a load connected to the load terminal in response to application of the signal to the control terminal, the load terminal being either an emitter terminal or a source terminal of the circuit device, wherein the load is to be connected between the load terminal and a return terminal of the power supply;

a bias current source connected between the load terminal and the return terminal;

a current bypass in parallel with the bias current source; and a voltage sensor connected between the control terminal and the load terminal for sensing a voltage drop developed between the control terminal and the load terminal, the voltage sensor being operative to activate the current bypass to conduct current in parallel with current flow of the bias current source upon an exceeding of a threshold by the voltage drop.

2. A driver according to claim 1, wherein the circuit device is a field-effect transistor (FET).

3. A driver according to claim 1, wherein the bias current source comprises a current mirror circuit.

4. A driver according to claim 1, wherein said current bypass comprises an FET.

5. A driver according to claim 1, wherein said voltage sensor comprises a differential amplifier, and wherein said driver further comprises means for offsetting a voltage of one input terminal of said differential amplifier relative to the voltage of a second input terminal of said differential amplifier.

6. The driver according to claim 5, wherein said differential amplifier is operative as a comparator.

7. A driver according to claim 1, wherein said circuit device is operative to drive said load in one direction, and said current bypass is operative to drive said load in a second direction opposite to said first direction.

* * * * *